United States Patent
Aleksov et al.

(10) Patent No.: US 12,347,761 B2
(45) Date of Patent: Jul. 1, 2025

(54) MAGNETIC PLANAR SPIRAL AND HIGH ASPECT RATIO INDUCTORS FOR POWER DELIVERY IN THE GLASS-CORE OF A PACKAGE SUBSTRATE

(71) Applicant: Intel Corporation, Santa Clara, CA (US)

(72) Inventors: Aleksandar Aleksov, Chandler, AZ (US); Neelam Prabhu Gaunkar, Chandler, AZ (US); Georgios C. Dogiamis, Chandler, AZ (US); Telesphor Kamgaing, Chandler, AZ (US); Veronica Strong, Hillsboro, OR (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 868 days.

(21) Appl. No.: 17/350,818

(22) Filed: Jun. 17, 2021

(65) Prior Publication Data
US 2022/0406698 A1 Dec. 22, 2022

(51) Int. Cl.
*H01L 23/498* (2006.01)
*H01F 27/28* (2006.01)
*H01L 21/48* (2006.01)
*H01L 23/58* (2006.01)

(52) U.S. Cl.
CPC ... *H01L 23/49827* (2013.01); *H01F 27/2804* (2013.01); *H01L 21/486* (2013.01); *H01L 23/58* (2013.01)

(58) Field of Classification Search
CPC . H01L 23/49827; H01L 23/58; H01L 21/486; H01F 27/2804
USPC .......................................................... 361/782
See application file for complete search history.

(56) References Cited

U.S. PATENT DOCUMENTS

2019/0189528 A1* 6/2019 Kim .................. H01L 23/66
2020/0066659 A1* 2/2020 Lambert .......... H01L 23/49582

* cited by examiner

*Primary Examiner* — Andargie M Aychillhum
(74) *Attorney, Agent, or Firm* — Schwabe, Williamson & Wyatt P.C.

(57) ABSTRACT

Embodiments disclosed herein include electronic packages with magnetic features and methods of forming such packages. In an embodiment, a package substrate comprises a core and a conductive via through a thickness of the core. In an embodiment, a shell surrounds a perimeter of the conductive via and the shell is a magnetic material. In an embodiment, a surface of the conductive via is spaced away from the shell.

23 Claims, 18 Drawing Sheets

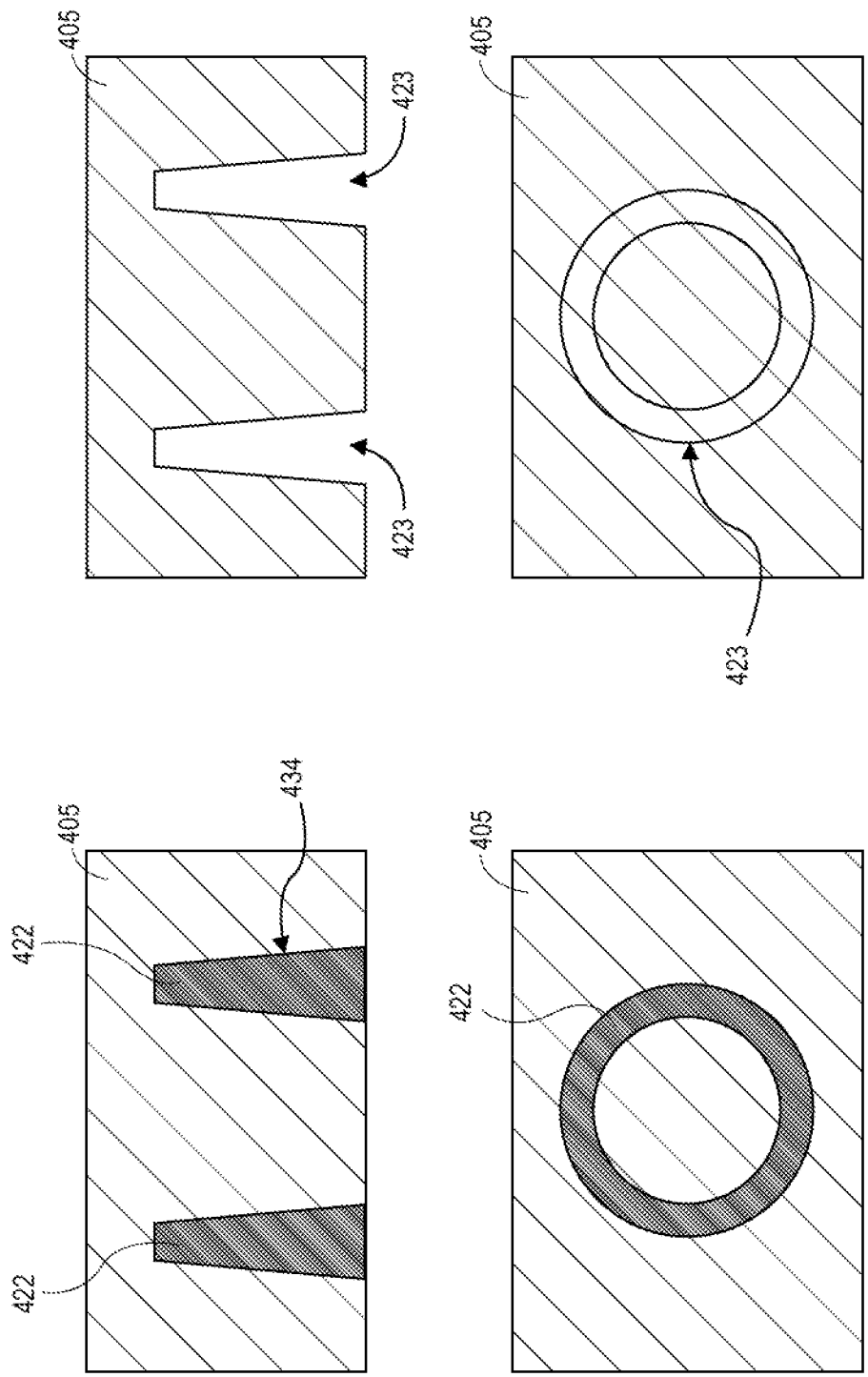

MAGNETIC PLANAR SPIRAL AND HIGH ASPECT RATIO INDUCTORS FOR POWER DELIVERY IN THE GLASS-CORE OF A PACKAGE SUBSTRATE

TECHNICAL FIELD

Embodiments of the present disclosure relate to electronic packages, and more particularly to package substrates with a glass core and high aspect ratio inductors embedded in the glass core.

BACKGROUND

Inductors are increasingly crucial to high performance, fast and clean (low noise), power delivery to the die. As dies become more powerful and current hungry, power regulators (e.g., voltage regulators) need to be moved closer to the die in order to decrease any losses or parasitic elements. As such, power inductors integrated in the package substrate are becoming more important to the design of electronic packages.

Currently, vertically oriented magnetic inductors can be formed through the core of the package substrate. Such inductors are formed by mechanically drilling a hole through the core, filling the hole with a pluggable magnetic material, mechanically drilling a second hole in the magnetic material, and forming a plated through hole via in the second hole. The use of mechanical drilling has significant drawbacks. Particularly, the inductor density is low due to the relatively large diameter and pitch of the drilling process. More so, the need to make two drill holes for each inductor further limits the ability to increase the density of the inductors. Additionally, the magnetic material is limited to pluggable materials. This limits the ability to use high relative permeability materials that increase the inductance of the inductors. Demagnetization effects (shape anisotropy and particle density) can also impact inductance. The demagnetization field leads to a net magnetization within the magnetic material to reduce the overall magnetic moment.

BRIEF DESCRIPTION OF THE DRAWINGS

FIGS. 4A-4F are cross-sectional and corresponding plan view illustrations of a package core depicting a process for forming an embedded inductor, in accordance with an embodiment.

EMBODIMENTS OF THE PRESENT DISCLOSURE

Figure 1A:
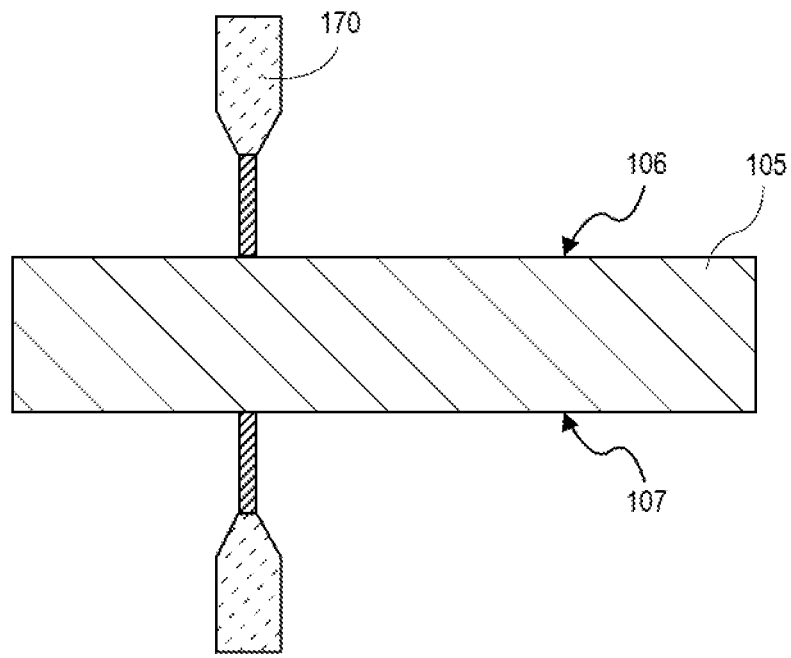
FIG. 1A is a cross-sectional illustration of a glass core with top and bottom surfaces that are being exposed with a laser, in accordance with an embodiment.

Described herein are package substrates with a glass core and high aspect ratio inductors embedded in the glass core, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, mechanically drilled plated through hole style inductors have multiple limitations. For example, the density of the inductors is low due to the large mechanical drill bits, and magnetic material selection is limited to pluggable materials. Accordingly, embodiments disclosed herein use laser-assisted etching processes on the package core. The core may be a material that is susceptible to a morphological change upon exposure to a laser. For example, the package core may be glass, and the morphological change may be from an amorphous crystal structure to a crystalline crystal structure. In other embodiments, the package core may be ceramic, silicon, or any other non-conductive semiconductor material. The exposed regions may then be etched.

The use of a laser allows for much finer dimensioned structures with smaller pitches. Whereas existing through core vias have diameters of 100 μm or larger and pitches of 250 μm or larger, the laser-assisted etching process may enable hole diameters that are approximately 50 μm or smaller and pitches that are approximately 40 μm or larger. Diameters of the holes may be able to be approximately 10 μm without masks, and potentially as small as 2 μm when a hardmask is also used. The thickness of the core may also be between approximately 100 μm and 1,000 μm. Though it is to be appreciated that embodiments may also apply to larger and/or smaller hole diameters, hole pitches, and core substrate thicknesses. As such, the inductor density can be increased.

In addition to improved inductors per unit area, the laser-assisted etching process allows for a broader range of magnetic materials to be used. Accordingly, much higher permeabilities can be obtained. This allows for a higher inductivity at a lower loss. Losses can also be reduced by fully filling the conductive vias instead of having plated through holes.

Referring now to FIGS. 1A-1D, a series of cross-sectional illustrations depicting a laser-assisted etching process to form features in a package core is shown, in accordance with an embodiment. The laser-assisted etching process may be used to form various features (e.g., the magnetic shells and the conductive vias) of the inductors described herein. As shown in FIG. 1A, the package core 105 is exposed by a laser 170. The laser 170 may be irradiated over both a first surface 106 and a second surface 107. However, the laser 170 may only irradiate a single surface of the core substrate 105 in other embodiments.

In an embodiment, the package core 105 may comprise a material that is capable of forming a morphological change as a result of the exposure by the laser 170. For example, in the case of a glass package core 105, the morphological change may result in the conversion of an amorphous crystal structure to a crystalline crystal structure. While glass is used as an example here, it is to be appreciated that the package core 105 may also comprise ceramic materials, silicon, or other non-conductive semiconductor materials. In an embodiment, the package core 105 may have a thickness between the first surface 106 and the second surface 107 that is between 100 μm and 1,000 μm. However, it is to be appreciated that larger or smaller thicknesses may also be used for the package core 105 in other embodiments.

Figure 1B:
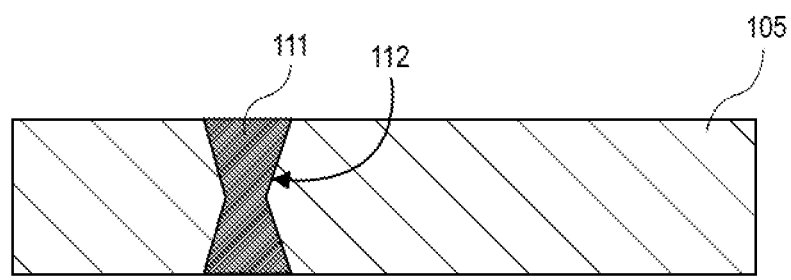
FIG. 1B is a cross-sectional illustration of the glass core with regions that have their morphology altered by the laser, in accordance with an embodiment.

Referring now to FIG. 1B, a cross-sectional illustration of the package core 105 after the morphological change has occurred is shown, in accordance with an embodiment. As shown, an exposed region 111 is provided through a thickness of the package core 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the package core 105.

While shown as providing an exposed region 111 that passes through an entire thickness of the package core 105, it is to be appreciated that laser parameters may be modified in order to provide different structures. For example, a blind structure may be formed. A blind structure extends into, but not through, the package core 105.

Figure 1C:
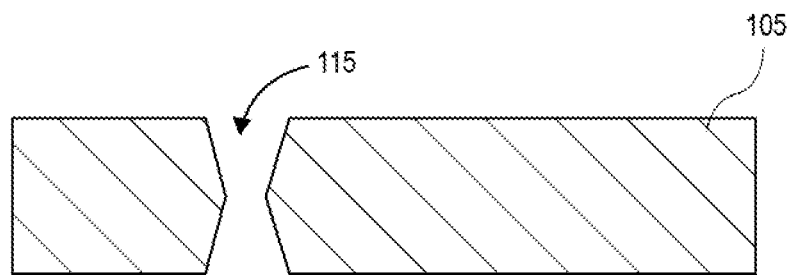
FIG. 1C is a cross-sectional illustration of the glass core with a via hole through a thickness of the glass core, in accordance with an embodiment.

Referring now to FIG. 1C, a cross-sectional illustration of the package core 105 after the exposed region 111 is removed to form a hole 115 through the package core 105 is shown, in accordance with an embodiment. In an embodiment, the hole 115 may be formed with an etching process that is selective to the exposed region 111 over the remainder of the package core 105. The etch selectivity of the exposed region 111 to the remainder of the package core 105 may be 10:1 or greater, or 50:1 or greater. That is, while selective to the exposed region 111, some portion of the package core 105 may also be etched, resulting in the thickness of the package core 105 being slightly reduced. In an embodiment, the etchant may be a wet etching chemistry.

Figure 1D:
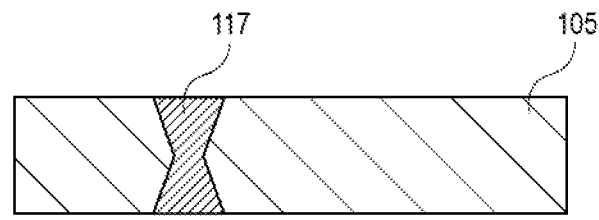
FIG. 1D is a cross-sectional illustration of the glass core with a via through the thickness of the glass core, in accordance with an embodiment.

Referring now to FIG. 1D, a cross-sectional illustration of the core substrate 105 after a via 117 is formed in the hole 115 is shown, in accordance with an embodiment. In an embodiment, the via 117 may be deposited with a plating process or any other suitable deposition process. In an embodiment, the hole 115 may have a maximum diameter that is approximately 100 μm or less, approximately 50 μm or less, or approximately 10 μm or less. The pitch between individual holes 115 in the package core 105 may be between approximately 10 μm and approximately 100 μm in some embodiments. The small diameters and pitch (compared to traditional plated through hole (PTH) vias that typically have diameters that are 100 μm or larger and pitches that are 100 μm or larger) allow for high density integration of vias.

In FIGS. 1A-1D only a single cross-section of the package core 105 is shown for simplicity. However, it is to be appreciated that the shape of the vias 117 may take substantially any form. This is because the laser providing the morphological change in the package core 105 may be moved in a controllable manner. Examples of various plan views of a via 217 in a package core 205 are shown in FIGS. 2A and 2B.

Figure 2A:
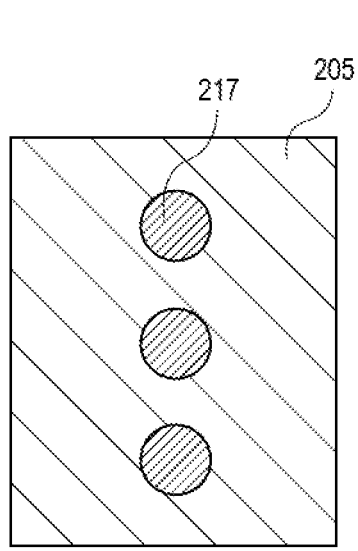
FIG. 2A is a plan view illustration of the glass core with a plurality of circular vias, in accordance with an embodiment.

Referring now to FIG. 2A, a plan view illustration of a package core 205 with a plurality of circular vias 217 is shown, in accordance with an embodiment. While three vias 217 are shown, it is to be appreciated that any number of vias 217 may be provided in any configuration.

Figure 2B:
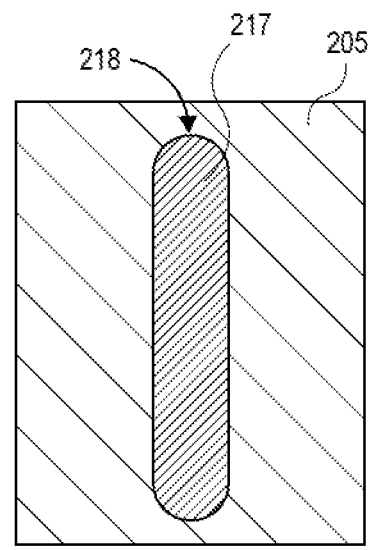
FIG. 2B is a plan view illustration of the glass core with a vertical via plane, in accordance with an embodiment.

Referring now to FIG. 2B, a plan view illustration of a package core 205 with a via 217 that is extended along one direction is shown, in accordance with an embodiment. Such a via 217 may be referred to herein as a "via plane" or simply a "plane". The via plane 217 may have a thickness through the package core 205 that is substantially uniform, while also being extended in a direction, as opposed to having a width and length that are substantially uniform. As shown in FIG. 2B, the ends of the via structure 217 may be rounded surfaces 218. The rounded surfaces may be the result of the shape of the laser irradiation. That is, the focus of the laser may be substantially circular in some embodiments.

Figure 3A:
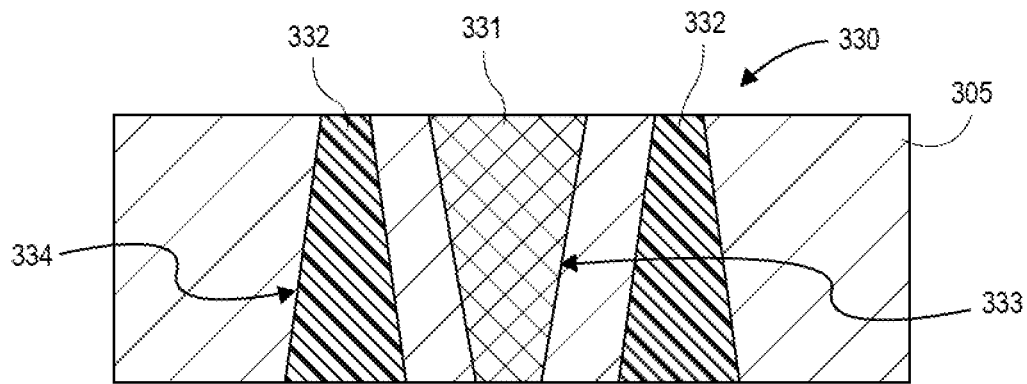
FIG. 3A is a cross-sectional illustration of a vertically oriented inductor embedded in a package core, in accordance with an embodiment.

Referring now to FIG. 3A, a cross-sectional illustration of an inductor 330 is shown, in accordance with an embodiment. The inductor 330 may be embedded within a package core 305. For example, the core 305 may be a material that is susceptible to a morphological change when exposed to a laser. In a particular embodiment, the core 305 comprises glass. Other embodiments may include a core that is ceramic, silicon, or other non-conductive semiconductor materials. The core 305 may have a thickness that is between approximately 50 μm and approximately 1,000 μm.

In an embodiment, the inductor 330 is a vertically oriented inductor. That is, the conductive via 331 of the inductor 330 is oriented to pass from a top surface of the core 305 to the bottom surface of the core 305. In an embodiment, the conductive via 331 may be copper or the like. The conductive via 331 may have sloped sidewalls 333. The sloped sidewalls 333 may be characteristic of the laser-assisted etching process used to form the inductor 330. As shown, the conductive via 331 is a fully filled feature. That is, there is no hole through an axial center of the conductive via 331, as is the case with traditional PTH architectures. In an embodiment, the conductive via 331 may have a maximum diameter that is approximately 100 μm or less, approximately 50 μm or less, or approximately 10 μm or less.

In an embodiment, the inductor 330 further comprises a magnetic shell 332. The magnetic shell 332 wraps around a perimeter of the conductive via 331. As shown, the portions of the magnetic shell 332 on the left of the conductive via 331 and on the right of the conductive via 331 connect to each other outside of the plane of FIG. 3A. In an embodiment, the magnetic shell 332 may be a metallic conductive material. For example, the magnetic shell 332 may comprise magnetic paste materials (e.g., epoxides heavily loaded with magnetic fillers such as Fe, Mn or Co (or alloys thereof)), plated magnetic materials (e.g., Fe, Ni, alloys thereof), or sputter and/or plasma deposited materials (e.g., $Fe_{16}N_2$). However, it is to be appreciated that other materials in each class are also possible in accordance with other embodiments. Such materials have higher magnetic permeabilities than pluggable magnetic materials. This allows for a higher inductivity with lower losses.

In an embodiment, the magnetic shell 332 may have sidewalls 334 that are sloped. The slope of the sidewalls 334 may be characteristic of a laser-assisted etching process. In the particular embodiment shown in FIG. 3A, the slope of the sidewalls 334 of the magnetic shell 332 is opposite from the slope of the sidewalls 333 of the conductive via 331. That is, the wide end of the magnetic shell 332 may be on the opposite surface of the core 305 than the wide end of the conductive via 331. However, in other embodiments, the slopes of the sidewalls 334 may be the same direction as the slope of the sidewalls 333.

In an embodiment, a spacing between the inner surface of the magnetic shell 332 and the surface of sidewalls 333 of the conductive via 331 may be approximately 100 μm or smaller, approximately 50 μm or smaller, or approximately 10 μm or smaller. Such small spacings are made possible by the use of the laser-assisted etching process. Due to the precision of the laser exposure, small spacings are possible.

Figure 3B:
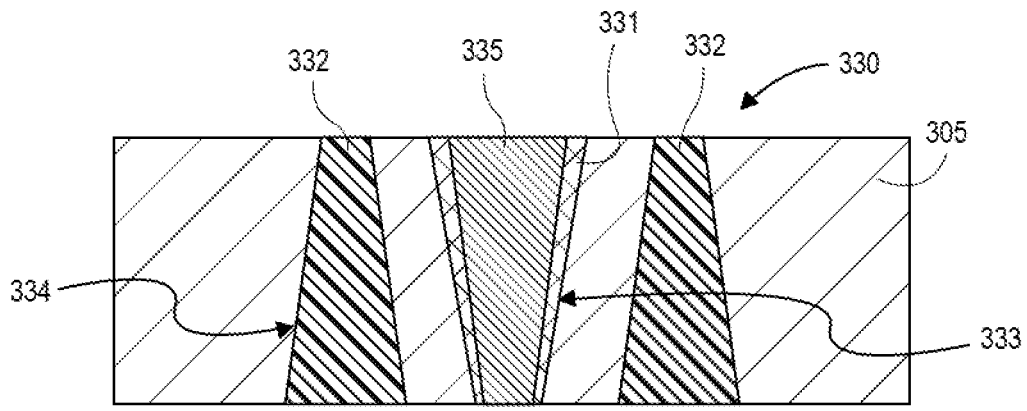
FIG. 3B is a cross-sectional illustration of a vertically oriented inductor embedded in a package core with a conductive shell filled with a plug, in accordance with an embodiment.

Referring now to FIG. 3B, a cross-sectional illustration of an inductor 330 is shown, in accordance with an additional embodiment. The inductor 330 in FIG. 3B may be substantially similar to the inductor 330 in FIG. 3A, with the exception of the conductive via 331 have a hole through its center. In an embodiment, the hole is filled with an insulative plug material 335. Such embodiments may be used when the via hole cannot be completely filled with a plating process. While similar to a traditional PTH design in this respect, it is to be appreciated that the overall structure is still different. The differences include, but are not limited to, the presence of sloped sidewalls 333 and 334, and the presence of a portion of the core 305 between the magnetic shell 332 and the conductive via 331.

Figure 3C:
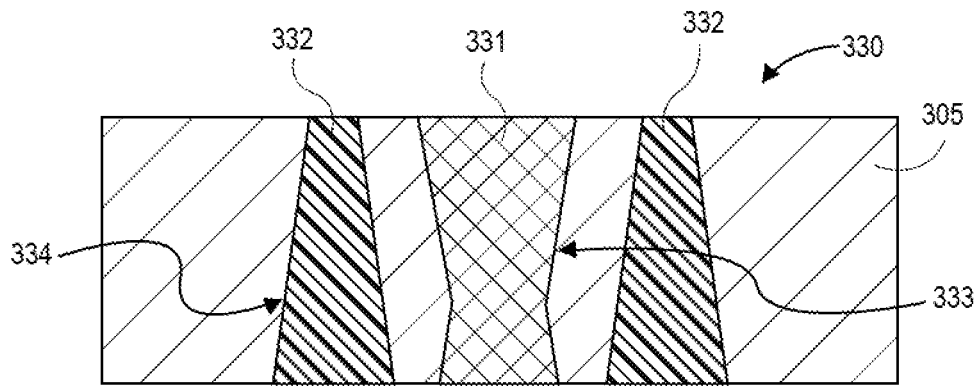
FIG. 3C is a cross-sectional illustration of a vertically oriented inductor embedded in a package core with a conductive via with an hourglass shaped cross-section, in accordance with an embodiment.

Referring now to FIG. 3C, a cross-sectional illustration of an inductor 330 is shown, in accordance with an additional embodiment. In an embodiment, the inductor 330 in FIG. 3C is substantially similar to the inductor 330 in FIG. 3A, with the exception of the cross-section of the conductive via 331. Instead of a trapezoidal cross-section, embodiments may include a conductive via 331 with an hourglass shaped cross-section. An hourglass shaped cross-section may be provided when the hole for the conductive via 331 is formed by laser exposure to both surfaces of the core 305.

Referring now to FIGS. 4A-4F, a series of illustrations depicting a process for forming an inductor embedded in a core is shown, in accordance with an embodiment. In each Figure, the top illustration is a cross-sectional illustration and the bottom illustration is a plan view illustration.

Referring now to FIG. 4A, a cross-sectional illustration and a corresponding plan view illustration of a core 405 that has been exposed by a laser are shown, in accordance with an embodiment. As shown, the exposed regions 422 may form a ring. The exposed regions 422 are located where the magnetic shell is desired. As shown, the exposed regions 422 do not extend entirely through the core 405. Such blind structures are capable of being formed with the laser-assisted etching process. The exposed regions 422 do not extend entirely through the core 405 so that the portion of the core 405 inside the shell of the exposed region 422 remains connected to the remainder of the core 405 during the etching process. In an embodiment, the exposed regions 422 may comprise a sloped sidewall 434, typical of the laser-assisted etching process.

In an embodiment, the core 405 is a material that is morphologically changed by the exposure of a laser. For example, the core 405 may be glass. In such an embodiment, the exposed regions 422 may be converted to a crystalline crystal structure, and the unexposed regions remain amorphous. In other embodiments, the core 405 may comprise a ceramic, silicon, or other non-conductive semiconductors.

Referring now to FIG. 4B, a cross-sectional illustration and a corresponding plan view illustration of the core 405 after an etching process is implemented are shown, in accordance with an embodiment. The etching process may be a wet etching process. In an embodiment, the etchant has a high selectivity of the exposed regions 422 over the unexposed regions. For example, the selectivity may be 10:1 or greater, or 50:1 or greater. The etching process results in the formation of blind hole 423 into the core 405. A blind hole 423 is a hole that goes into, but not through, the core 405.

Figure 4C:
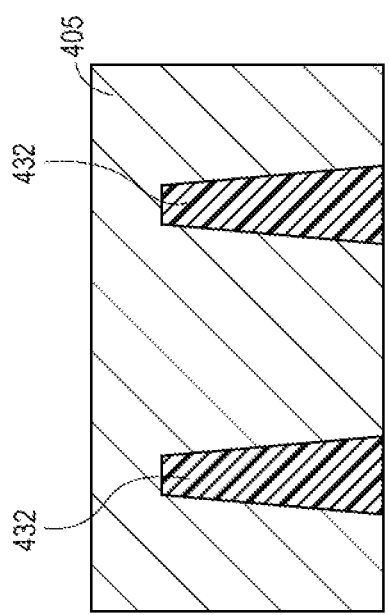
Figure 4C:
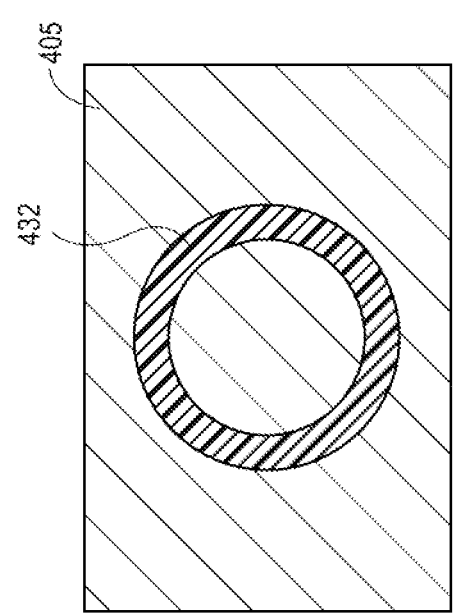

Referring now to FIG. 4C, a cross-sectional illustration and a corresponding plan view illustration of the core 405 after a magnetic shell 432 is disposed in the hole 423 are shown, in accordance with an embodiment. As shown, the magnetic shell 432 forms a circular shell that extends into, but not through the core 405. The magnetic shell 432 may be any material that can be disposed into the hole 423. The range of materials for the magnetic shell 432 is expanded greatly compared to relying on only a pluggable material. As such, higher magnetic permeabilities are available. This leads to inductors with a higher inductivity with lower losses. In an embodiment, excess magnetic material may be recessed with a suitable process, such as polishing or grinding.

Figure 4D:
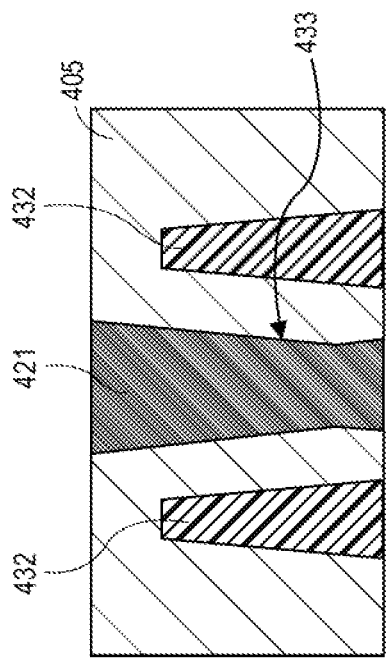
Figure 4D:
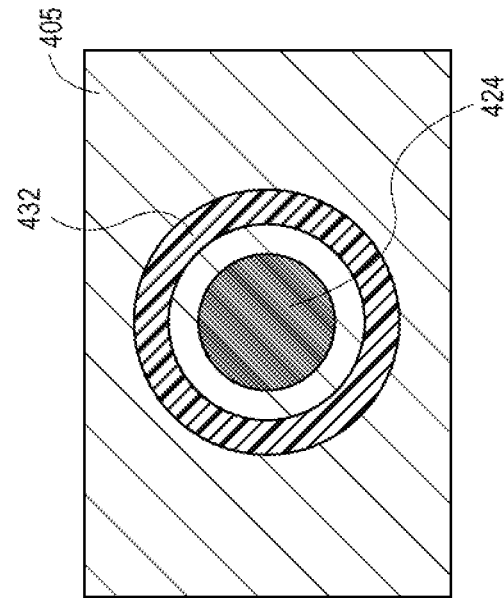

Referring now to FIG. 4D, a cross-sectional illustration and a corresponding plan view illustration of the core 405 after a second exposed region 421 is formed are shown, in accordance with an embodiment. In an embodiment, the exposed region 421 may be formed with a laser and have sloped sidewalls 433. In the illustrated embodiment, a dual sided exposure is used. The dual sided exposure may result in an exposed region 421 that has an hourglass shaped cross-section. Unlike the process used to form the magnetic shell 432, the central exposed region 421 extends through an entire thickness of the core 405.

Figure 4F:
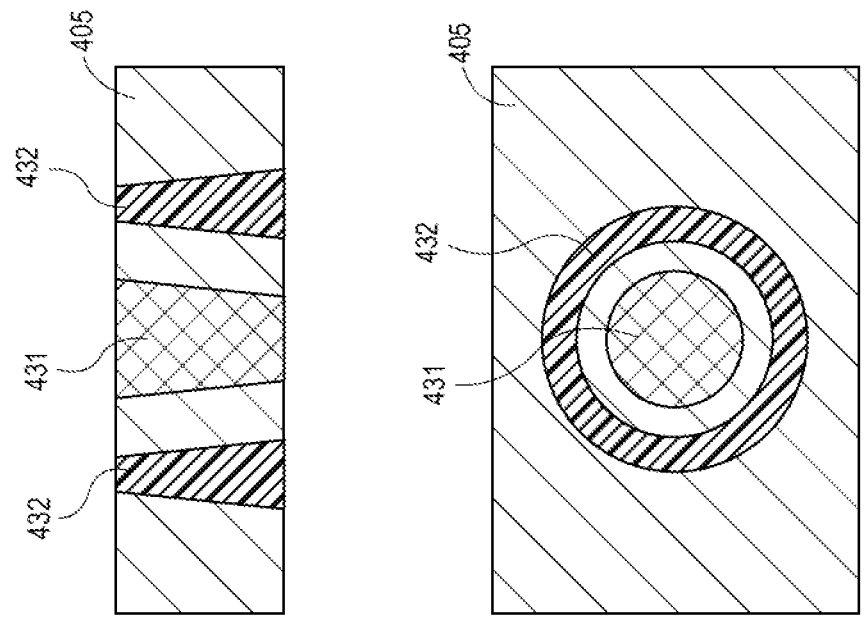
Figure 4E:
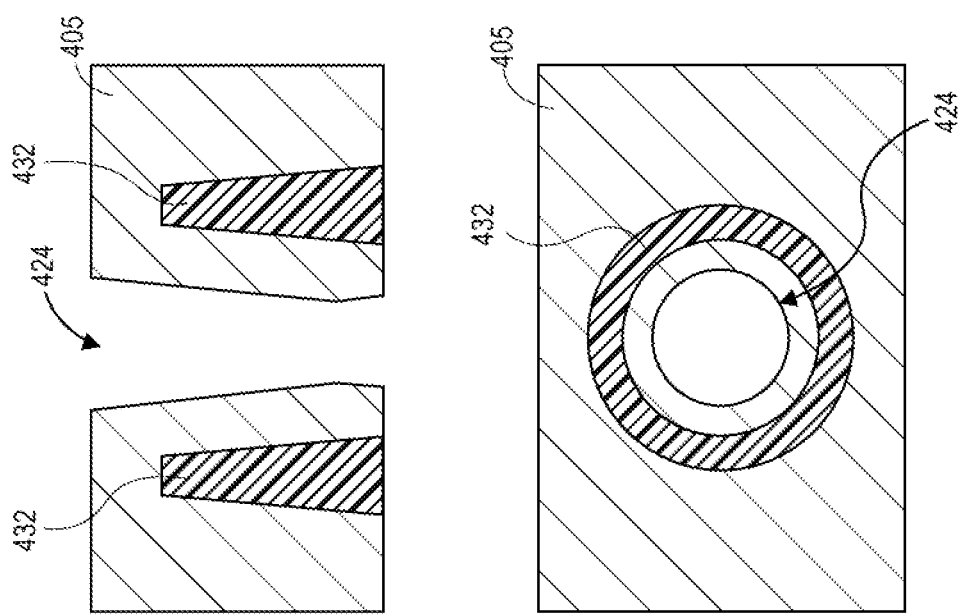

Referring now to FIG. 4E, a cross-sectional illustration and a corresponding plan view illustration of the core 405 after the second exposed region 421 is removed are shown, in accordance with an embodiment. In an embodiment, the removal of the second exposed region 421 results in the formation of a hole 424. The hole 424 may extend entirely through a thickness of the core 405. The second exposed region 421 may be removed with an etching process, similar to the etching process used to form the magnetic shell 432.

Referring now to FIG. 4F, a cross-sectional illustration and a corresponding plan view illustration of the core 405 after a conductive via 431 is formed in the hole 424 are shown, in accordance with an embodiment. In an embodiment, the hole 424 may be filled with a plating process. The hole 424 in FIG. 4F is entirely filled by the conductive via 431. In other embodiments, the conductive via 431 may partially fill the hole 424 and be plugged with an insulating material, similar to the embodiment shown in FIG. 3B. The conductive via 431 may comprise copper or the like.

After filling the hole 424 with the conductive via 431, surfaces of the core 405 may be polished or grinded. The recessing process exposes the buried end of the magnetic shell 432. As such, the resulting structure may include the magnetic shell 432 extending through an entire thickness of the core 405. The recessing process may also result in the cross-section of the conductive via 431 being converted from an hourglass shape to a trapezoidal shape. However, in cases where the recessing is less severe, the hourglass shape of the conductive via 431 may persist into the final structure, similar to the embodiment shown in FIG. 3C.

Referring now to FIGS. 5A-5F, a series of cross-sectional illustrations with corresponding plan view illustrations depicting a process for forming an inductor embedded in a core 505 is shown, in accordance with an embodiment.

Figure 5B:
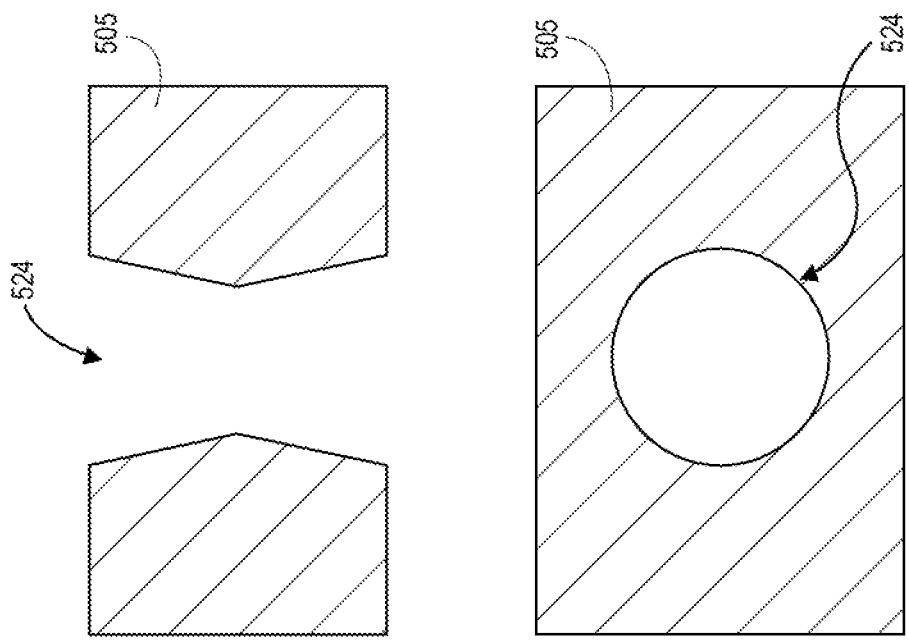
FIGS. 5A-5F are cross-sectional and corresponding plan view illustrations of a package core depicting a process for forming an embedded inductor, in accordance with an additional embodiment.
Figure 5A:
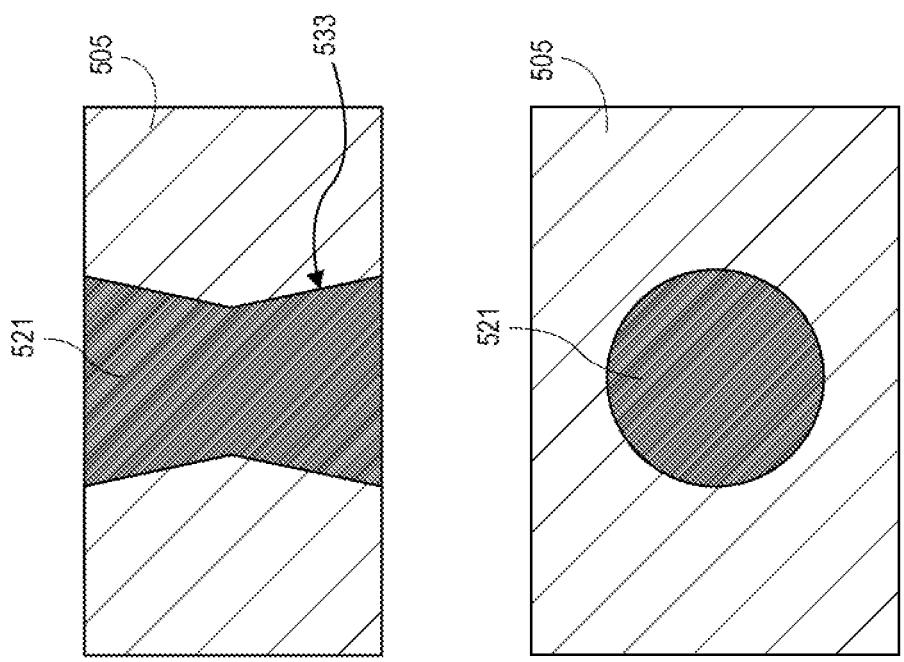

Referring now to FIG. 5A, a cross-sectional illustration and a corresponding plan view illustration of the core 505 are shown, in accordance with an embodiment. In an embodiment, an exposed region 521 is formed through a thickness of the core 505. The exposed region 521 may comprise sidewalls 533 that are sloped. In an embodiment, a dual sided laser exposure is used and the cross-sectional shape of the exposed region 521 may be hourglass shaped. In an embodiment, the core 505 may be glass. Other embodiments may include cores 505 that are ceramic, silicon, or other non-conductive semiconductors.

Referring now to FIG. 5B, a cross-sectional illustration and a corresponding plan view illustration of the core 505 after an etching process are shown, in accordance with an embodiment. In an embodiment, the etching process may result in the removal of the exposed region 521 in order to form a hole 524. The hole 524 may pass through an entire thickness of the core 505. The etching process may include a wet etching process with an etchant that is selective to the exposed region 521 over the remainder of the core 505.

Figure 5D:
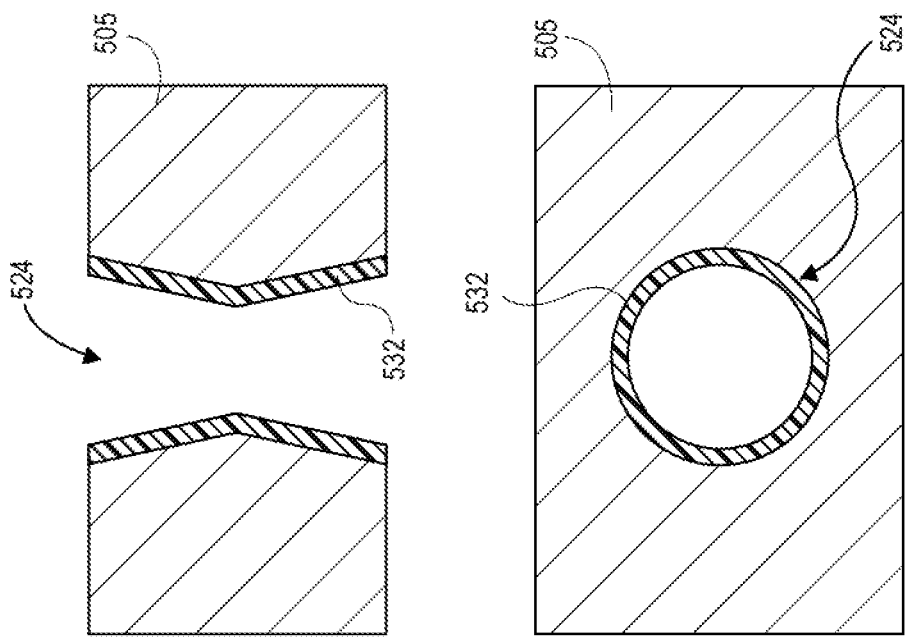
Figure 5C:
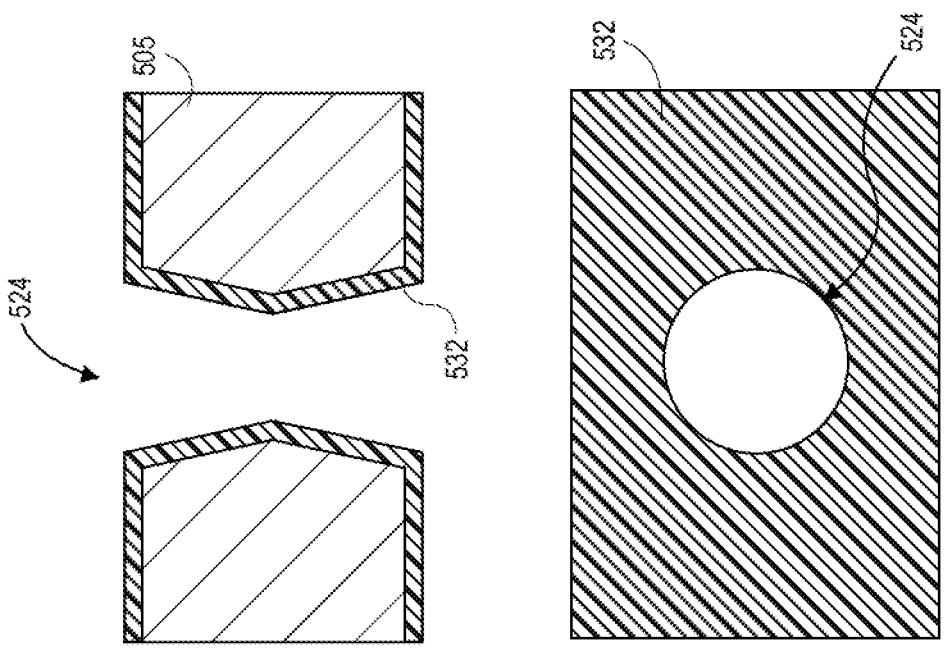

Referring now to FIG. 5C, a cross-sectional illustration and a corresponding plan view illustration of the core after a magnetic material 532 is plated over exposed surfaces are shown, in accordance with an embodiment. In an embodiment, the magnetic material deposition is a conformal deposition. In other embodiments, non-conformal deposition process may also be used. In yet another embodiment, the magnetic material 532 may be plugged into the hole 524 and subsequently drilled to form an opening through the magnetic material 532.

Referring now to FIG. 5D, a cross-sectional illustration and a corresponding plan view illustration of the core 505 after a recessing process are shown, in accordance with an embodiment. The recessing process may remove the magnetic material 532 from the top and bottom surface of the core 505. The recessing process may be a polishing or grinding process.

Figure 5F:
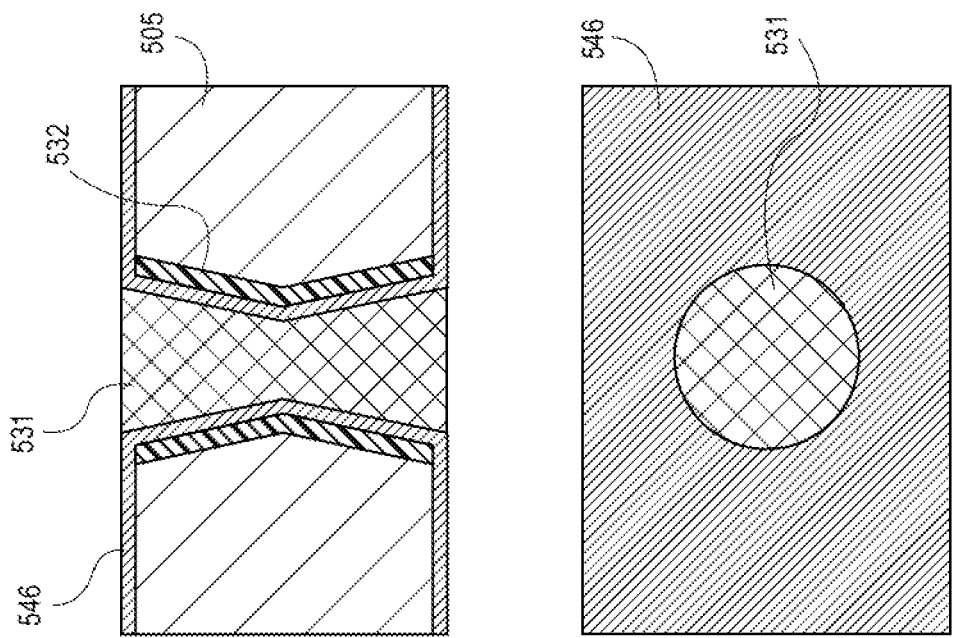
Figure 5E:
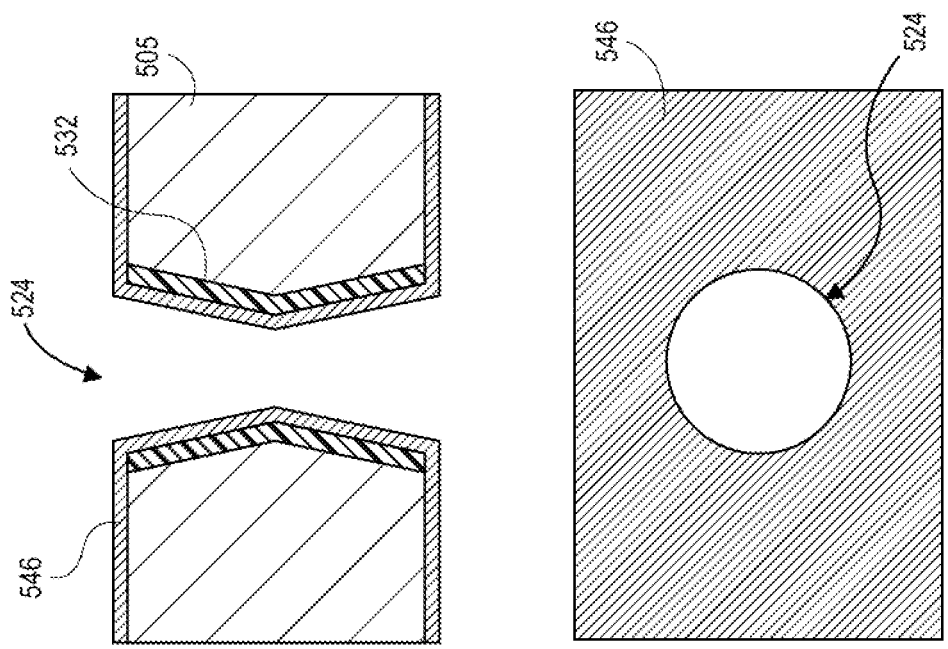

Referring now to FIG. 5E, a cross-sectional and a corresponding plan view illustration of the core 505 after a dielectric insulator 546 is deposited over the magnetic material 532 are shown, in accordance with an embodiment. The dielectric insulator 546 may be any suitable dielectric material that electrically isolates the conductive via from the magnetic material 532 (e.g., $SiO_2$, $Si_3N_4$, $Al_2O_3$ and the like). The dielectric insulator 546 may be deposited with processes such as CVD, ALD, and the like.

Referring now to FIG. 5F, a cross-sectional illustration and a corresponding plan view illustration of the core 505 after the conductive via 531 is formed are shown, in accordance with an embodiment. The conductive via 531 may be copper or the like. Excess conductive material may be removed with a polishing or grinding process.

As shown in FIG. 5F, the inductor comprises a conductive via 531 that has an hourglass shaped cross-section. The magnetic material 532 forms a shell that substantially conforms to the hourglass shape of the conductive via 531. The dielectric insulator 546 also conforms to the hourglass shape. In an embodiment, the dielectric insulator 546 may have a thickness that is approximately 10 µm or less, approximately 5 µm or less, or approximately 1 µm or less.

Figure 6A:
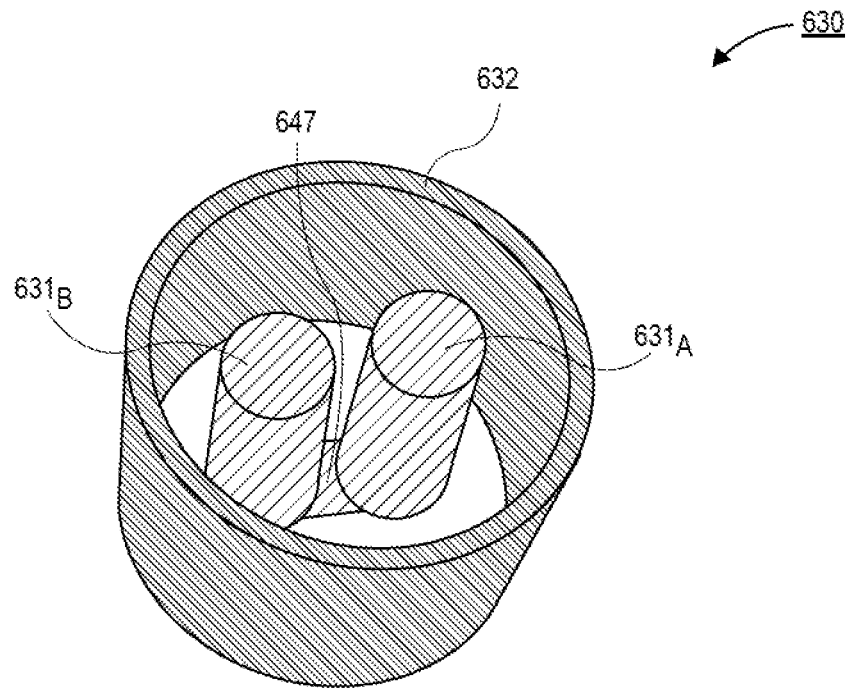
FIG. 6A is a perspective view illustration of an inductor with a pair of electrically coupled vias within a magnetic shell, in accordance with an embodiment.
Figure 6B:
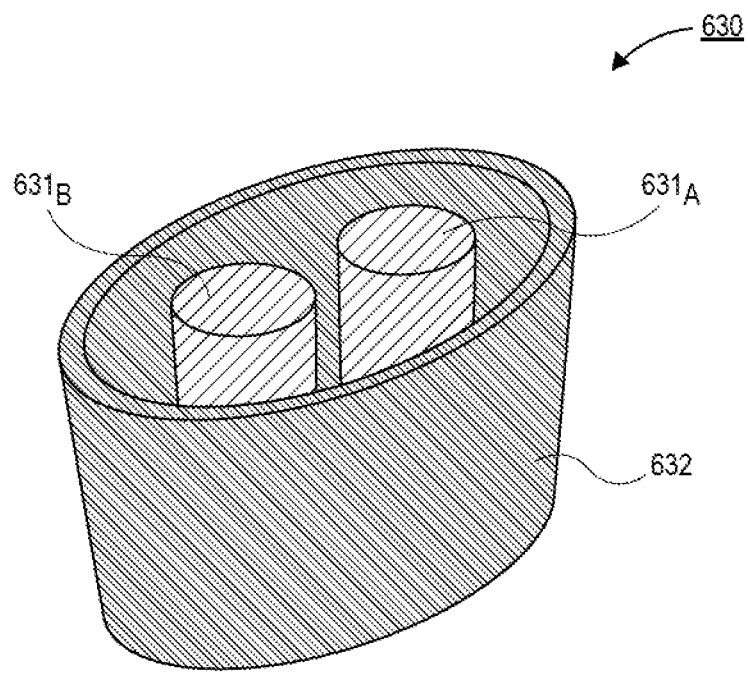
FIG. 6B is a perspective view illustration of an inductor with an oval shaped magnetic shell and a pair of vias within the magnetic shell, in accordance with an embodiment.

In the embodiments described above, each magnetic shell surrounds a single conductive via. However, embodiments are not limited to such configurations. FIGS. 6A and 6B provide additional architectures with more than one conductive via within the magnetic shell.

Referring now to FIG. 6A, a perspective view illustration of an inductor 630 is shown, in accordance with an embodiment. In an embodiment, the inductor 630 is embedded in a core (not shown) such as a glass core or the like. The structures of the inductor 630 may be formed with a laser-assisted etching process similar to embodiments described in greater detail above. Additionally, while the magnetic shell 632 and the conductive vias 631 have substantially vertical sidewalls, it is to be appreciated that the sidewalls may be sloped in some embodiments.

As shown, a pair of conductive vias $631_A$ and $631_B$ are positioned within the magnetic shell 632. The conductive vias $631_A$ and $631_B$ may be electrically coupled together by a trace 647. The trace 647 may be provided over a surface of the core (not shown) or in a buildup layer over the surface of the core. In the illustrated embodiment, the magnetic shell 632 is substantially circular in shape. However, it is to be appreciated that the magnetic shell 632 is not limited to such a shape.

For example, FIG. 6B is a perspective view illustration of an inductor 630 with an oval shaped magnetic shell 632. In addition to circular and oval shaped magnetic shells 632, embodiments may include polygonal shaped magnetic shells 632, or any other shape. Additionally, while two conductive vias 631 are shown within the magnetic shell 632, it is to be appreciated that any number of conductive vias 631 may be provided within the magnetic shell 632.

In the embodiments described above, the inductors are formed by passing a conductive via through a magnetic shell. However, embodiments are not limited to such configurations. For example, inductors may also be formed by winding a via plane around magnetic vias. Examples of such inductors are shown in FIGS. 7A and 7B.

Figure 7A:
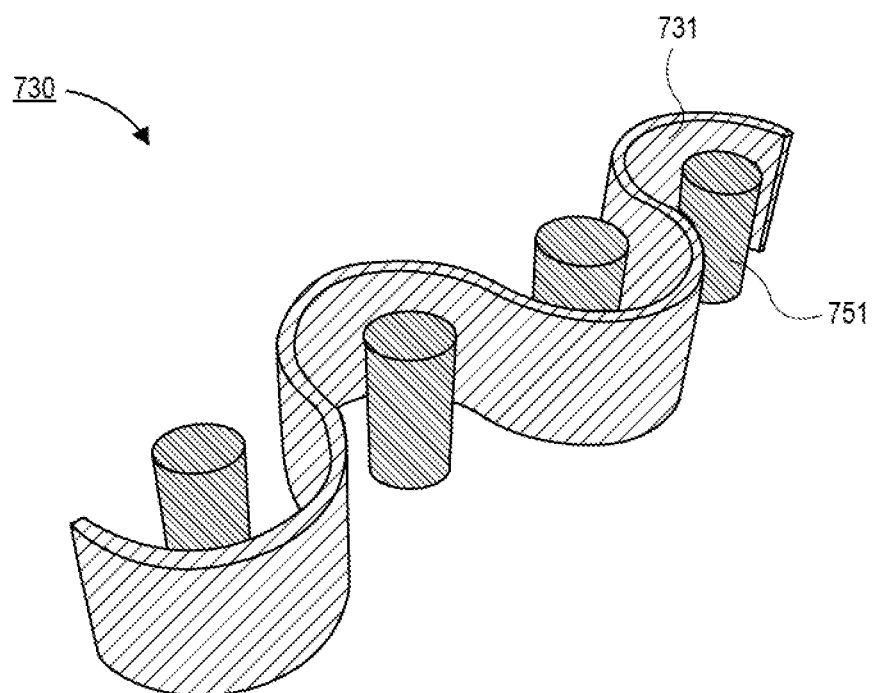
FIG. 7A is a perspective view illustration of an inductor with a serpentine via plane that wraps around magnetic vias with smooth turns, in accordance with an embodiment.

Referring now to FIG. 7A, a perspective view illustration of an inductor 730 is shown, in accordance with an embodiment. The inductor 730 may be embedded in a core (not shown) such as a glass core. In an embodiment, the inductor comprises a serpentine plane via 731. The plane via 731 is a via that is extended laterally in order to form a conductive plane. Such structures are easily fabricated using the laser-assisted etching process. In an embodiment, the serpentine shape of the plane via 731 wraps around a plurality of magnetic vias 751. In FIG. 7A, the turns of the plane via 731 are smooth. That is, the turns are not angular.

Figure 7B:
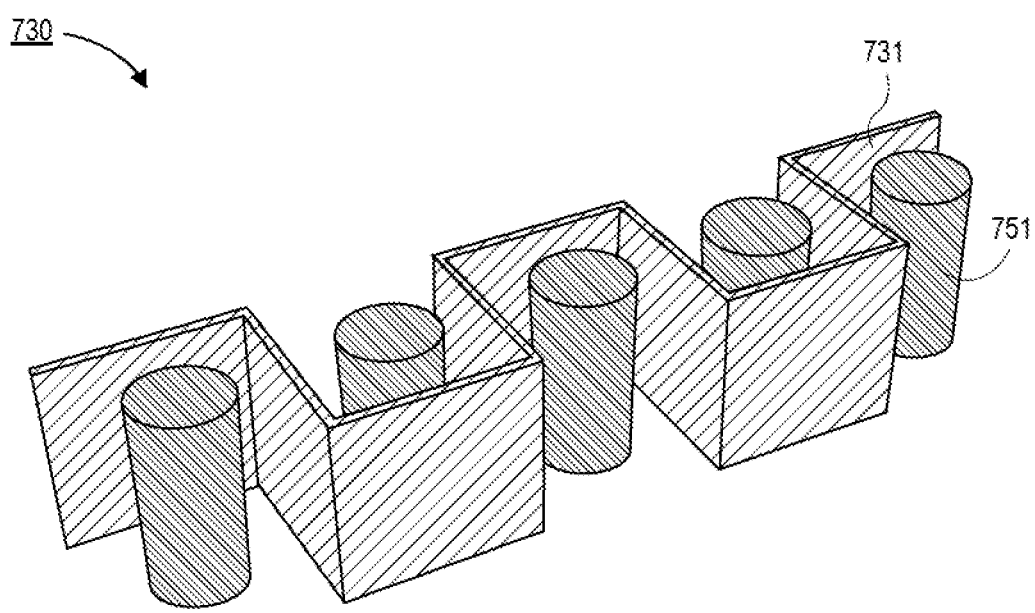
FIG. 7B is a perspective view illustration of an inductor with a serpentine via plane that wraps around magnetic vias with angular turns, in accordance with an embodiment.

Referring now to FIG. 7B, a perspective view illustration of an inductor is shown, in accordance with an additional embodiment. The inductor 730 in FIG. 7B may be substantially similar to the inductor 730 in FIG. 7A, with the exception of the turns being angular. For example, each of the turns of the plane via 731 are approximately 90°. However, angular turns may be made at any suitable angle in order to wrap around the magnetic vias 751.

In FIGS. 7A and 7B, the inductors 730 are shown with features that have substantially vertical sidewalls. However, it is to be appreciated that in some embodiments, the sidewalls may be sloped. For example, cross-sections of the plane via 731 may be hourglass shaped or trapezoidal. Similarly, cross-sections of the magnetic vias 751 may be hourglass shaped or trapezoidal.

Referring now to FIGS. 8A-8F, a series of cross-sectional and plan view illustrations depicting a process for forming an inductor embedded in a package core 805 is shown, in accordance with an embodiment. The inductor fabricated in accordance with FIGS. 8A-8F may be similar to the inductors 730 described above.

Figure 8A:
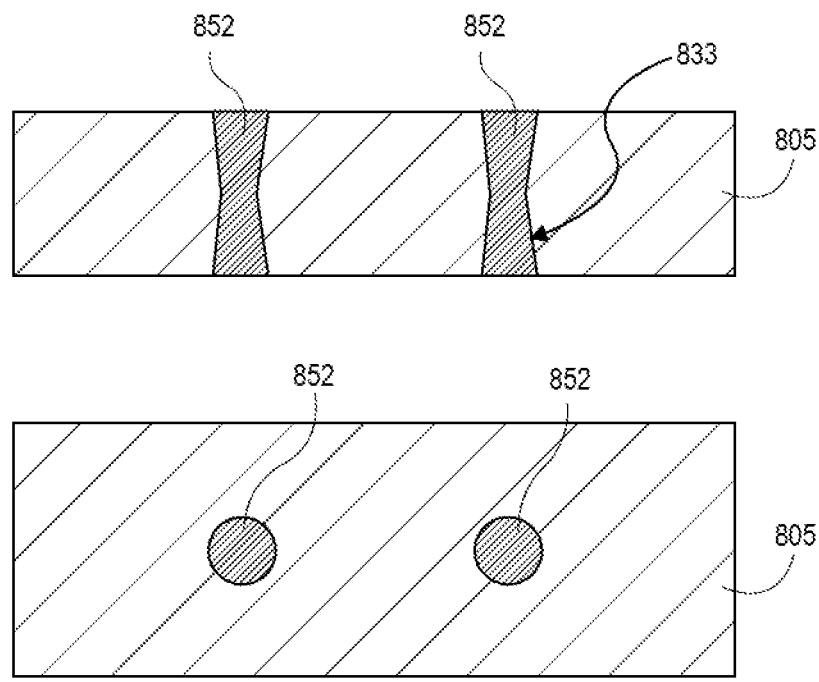
FIGS. 8A-8F are cross-sectional and corresponding plan view illustrations of a package core depicting a process for forming an inductor with a serpentine via plane that wraps around magnetic vias, in accordance with an embodiment.

Referring now to FIG. 8A, a cross-sectional illustration and a corresponding plan view illustration of a core 805 are shown, in accordance with an embodiment. In an embodiment, laser exposure is used to form exposed regions 852 through the core 805. The core 805 may be a glass core, or the like. The exposed regions 852 may be regions that are morphologically changed by the laser exposure. In an embodiment, sidewalls 833 of the exposed regions 852 may be sloped. The cross-section of the exposed regions 852 may be hourglass shaped in some embodiments.

Figure 8B:
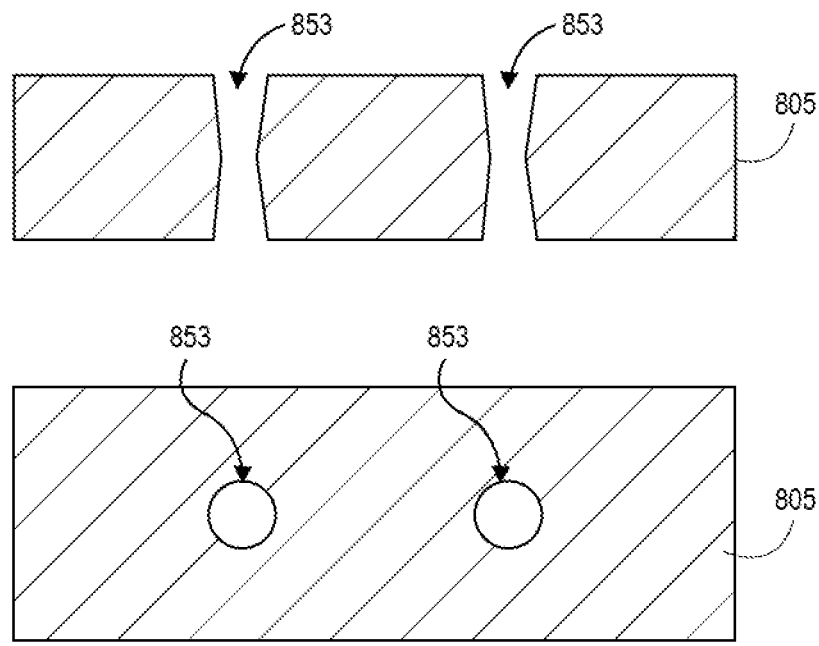

Referring now to FIG. 8B, a cross-sectional illustration and a corresponding plan view illustration of the core 805 after the exposed regions 852 are removed are shown, in accordance with an embodiment. The exposed regions 852 may be removed with an etching process, such as a wet etching process. The removal of the exposed regions 852 results in the formation of via holes 853 through a thickness of the core 805.

Figure 8C:
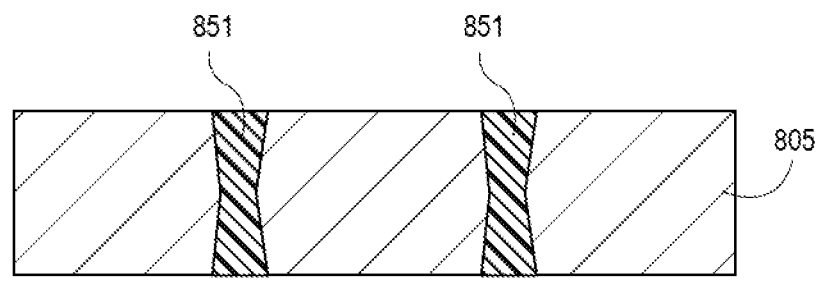
Figure 8C:
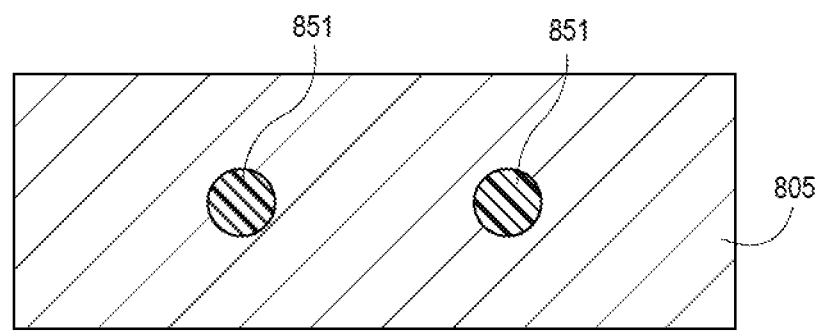

Referring now to FIG. 8C, a cross-sectional illustration and a corresponding plan view illustration of the core 805 after magnetic vias 851 are disposed in the holes 853 are shown, in accordance with an embodiment. Excess magnetic material over the top and bottom surfaces of the core 805 may be removed with a grinding or polishing process.

Figure 8D:
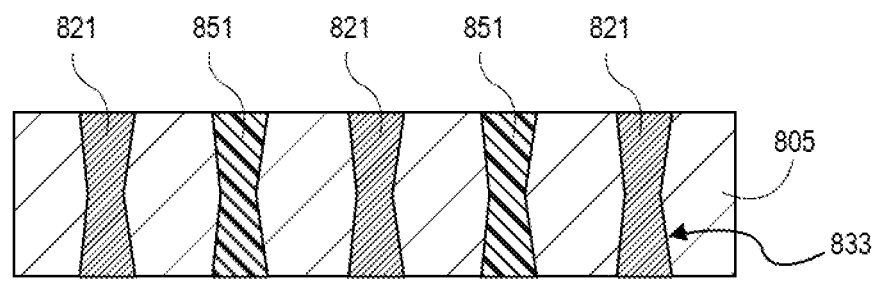
Figure 8D:
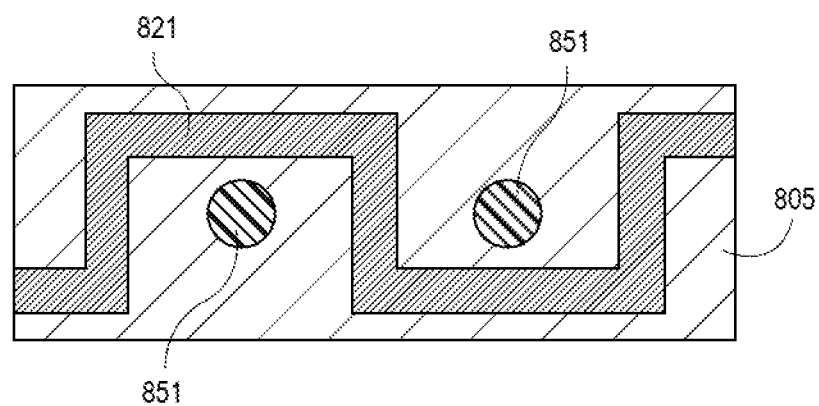

Referring now to FIG. 8D, a cross-sectional illustration and a corresponding plan view illustration of the core 805 after second exposed regions 821 are formed in the core 805 are shown, in accordance with an embodiment. In an embodiment, the second exposed regions 821 may be a serpentine plane that wraps around the magnetic vias 851. In FIG. 8D the serpentine pattern includes angular turns. However, in other embodiments, the serpentine pattern may include smooth turns. In an embodiment, a cross-sectional shape of the second exposed region 821 may be hourglass shaped or trapezoidal shaped.

Figure 8E:
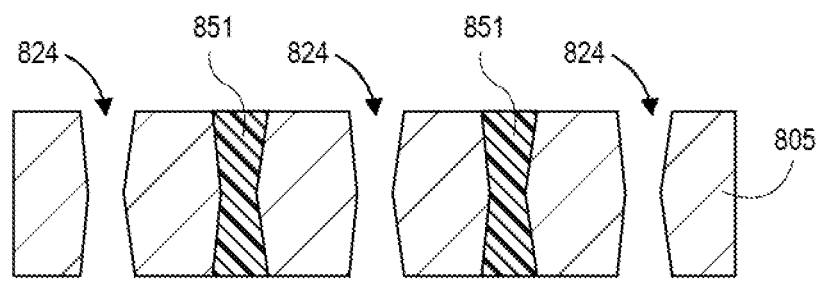
Figure 8E:
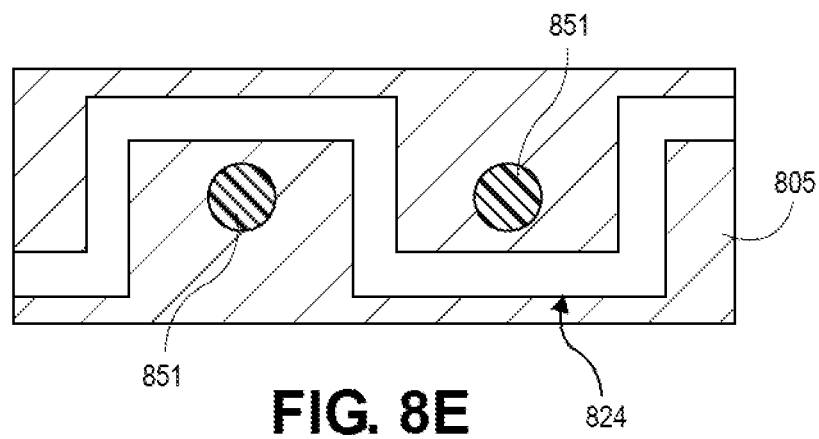

Referring now to FIG. 8E, a cross-sectional illustration and a corresponding plan view illustration of the core 805 after the second exposed region 821 is removed are shown, in accordance with an embodiment. Removal of the second exposed region 821 may form a serpentine hole 824 through a thickness of the core 805. The second exposed region 821 may be removed with an etching process, such as a wet etching process.

Figure 8F:
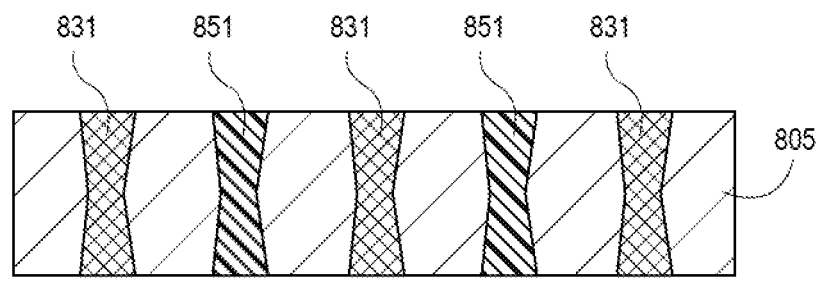
Figure 8F:
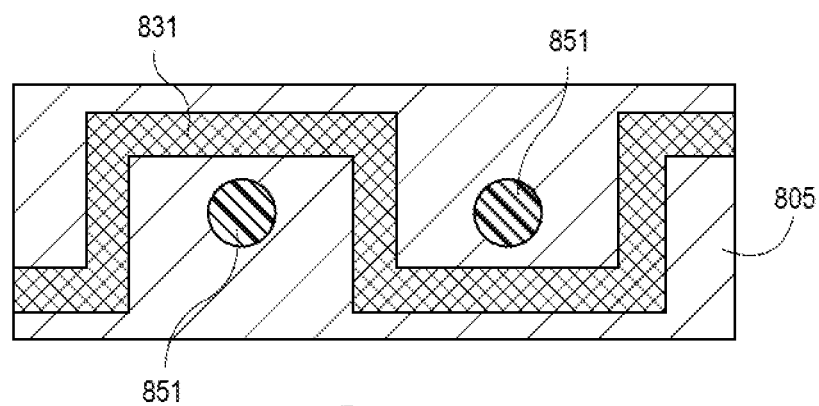

Referring now to FIG. 8F, a cross-sectional illustration and a corresponding plan view illustration of the core 805 after a serpentine plane via 831 is disposed into the serpentine hole 824 are shown, in accordance with an embodiment. The serpentine plane via 831 may be formed with a plating process or the like. Excess conductive material may be removed from the top and bottom surface of the core 805 with a polishing or grinding process.

Figure 9:
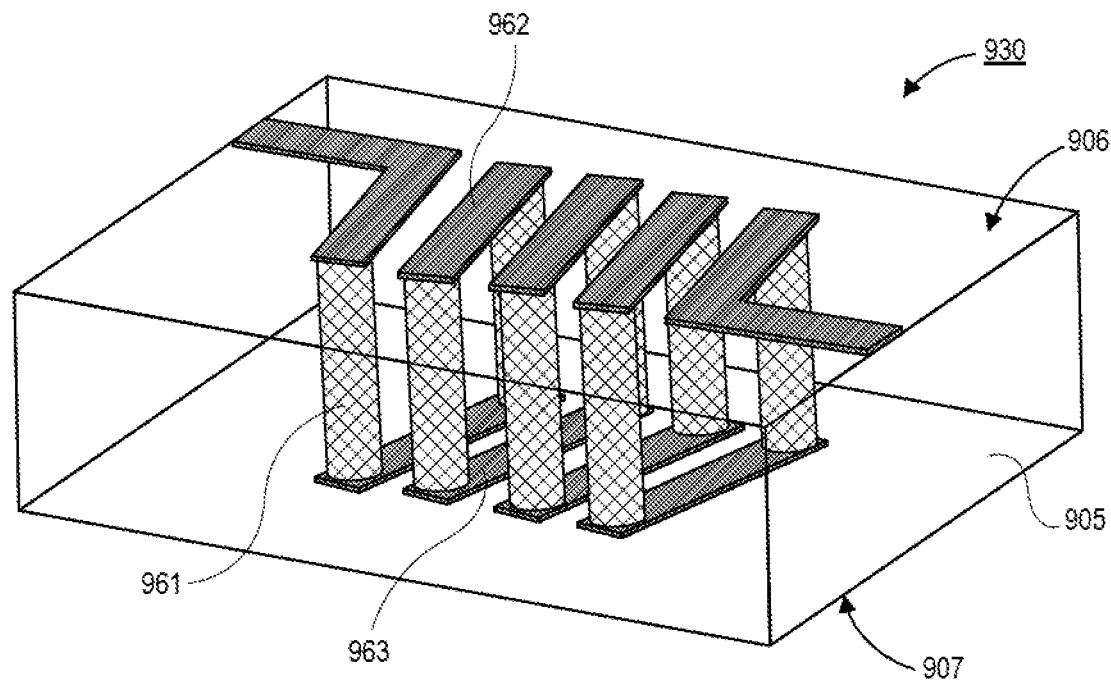
FIG. 9 is a perspective view illustration of a vertically oriented multi-turn inductor embedded in a package core, in accordance with an embodiment.

Referring now to FIG. 9, a perspective view illustration of an inductor 930 embedded in a core 905 is shown, in accordance with an additional embodiment. The inductor 930 may include a plurality of turns that are vertically oriented. The turns have vertical components that are made by conductive vias 961. Horizontal components of the turn are implemented by traces 962/963 over the surfaces 906/907 of the core 905. In the illustrated embodiment, the traces 962/963 are directly on the core 905. In other embodiments, the traces 962/963 are on a buildup layer (not shown) over surfaces of the core 905. While four turns are shown, it is to be appreciated that any number of turns may be used in the inductor 930. In an additional embodiment, a magnetic core may pass through a center of the turns in order to increase the inductance of the inductor 930.

In the illustrated embodiment, the conductive vias 961 are shown with substantially vertical sidewalls. In other embodiments, the conductive vias 961 may have sloped sidewalls characteristic of laser-assisted etching processes.

For example, the cross-sectional shape of the conductive vias 961 may be hourglass shaped or trapezoidal shaped.

Referring now to FIGS. 10A-10D, illustrations of inductors that are designed to limit demagnetization are shown, in accordance with various embodiments. In order to include magnetic material in a non-cylindrical manner around the conductive via, different structures can be used for the magnetic material. These modifications to the magnetic region may be helpful in limiting the demagnetization impact. Demagnetization occurs because an internal magnetic moment arises within the magnetized material due to creation of magnetic poles. It is dependent on the shape of the magnetized region. Hence, limiting the cross-section of the magnetized region (e.g., to ring-shaped toroids or long cylinders) can limit the overall shape anisotropy effect leading to a higher overall inductance.

Figure 10A:
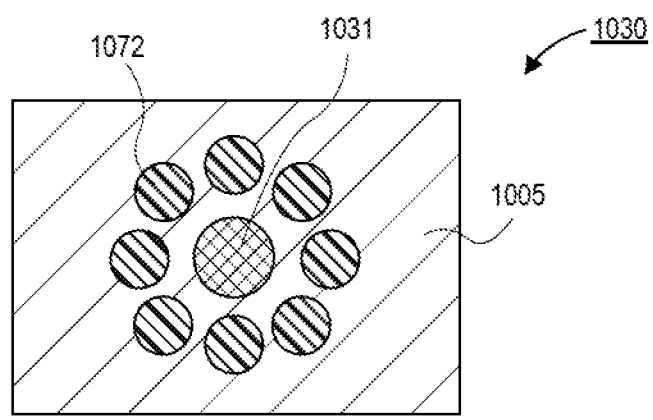
FIG. 10A is a plan view illustration of an inductor with a conductive via surrounded by a plurality of magnetic pillars, in accordance with an embodiment.

Referring now to FIG. 10A, a plan view illustration of an inductor 1030 is shown, in accordance with an embodiment. The inductor 1030 comprises a conductive via 1031 through a thickness of the core 1005. Instead of providing a shell around the conductive via 1031, a plurality of cylindrical magnets 1072 surround a perimeter of the conductive via 1031.

Figure 10B:
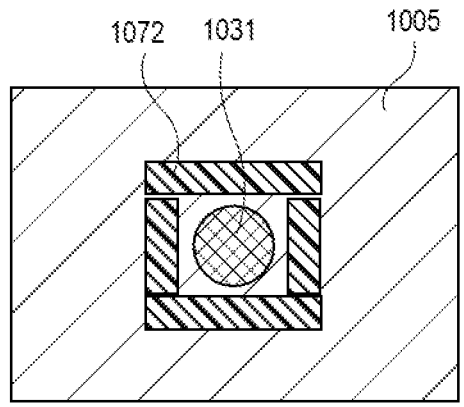
FIG. 10B is a plan view illustration of an inductor with a conductive via surrounded by a plurality of rectangular magnetic pillars, in accordance with an embodiment.

Referring now to FIG. 10B, a plan view illustration of an inductor 1030 is shown, in accordance with an additional embodiment. The inductor 1030 comprises a conductive via 1031 through a thickness of the core 1005. Instead of providing a shell around the conductive via 1031, a plurality of rectangular magnets 1072 surround a perimeter of the conductive via 1031.

Figure 10C:
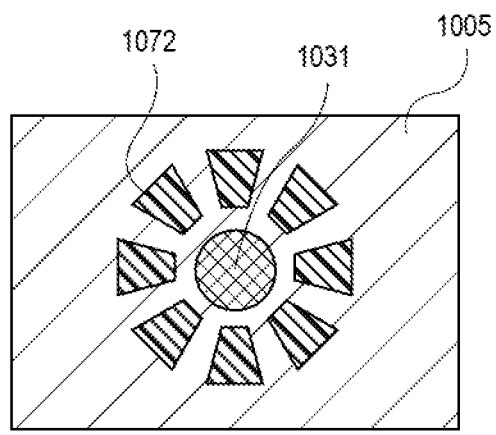
FIG. 10C is a plan view illustration of an inductor with a conductive via surrounded by a plurality of magnetic pillars, in accordance with an embodiment.

Referring now to FIG. 10C, a plan view illustration of an inductor 1030 is shown, in accordance with an additional embodiment. The inductor 1030 comprises a conductive via 1031 through a thickness of the core 1005. Instead of providing a shell around the conductive via 1031, a plurality of trapezoidal magnets 1072 surround a perimeter of the conductive via 1031.

Figure 10D:
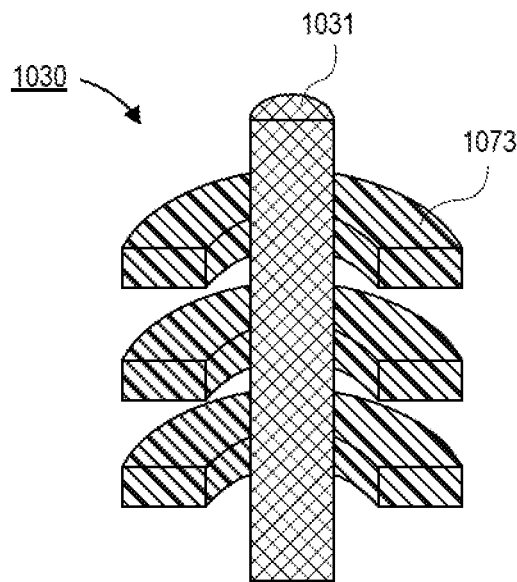
FIG. 10D is a sectional view illustration of an inductor with a conductive via surrounded by a plurality of magnetic rings, in accordance with an embodiment.

Referring now to FIG. 10D, a sectional illustration of an inductor 1030 is shown, in accordance with an additional embodiment. The inductor 1030 may comprise a conductive via 1031 through a thickness of a core (not shown). A plurality of magnetic rings 1073 may surround a perimeter of the conductive via 1031. The magnetic rings 1073 may be provided at different z-heights of the conductive via 1031.

Figure 11:
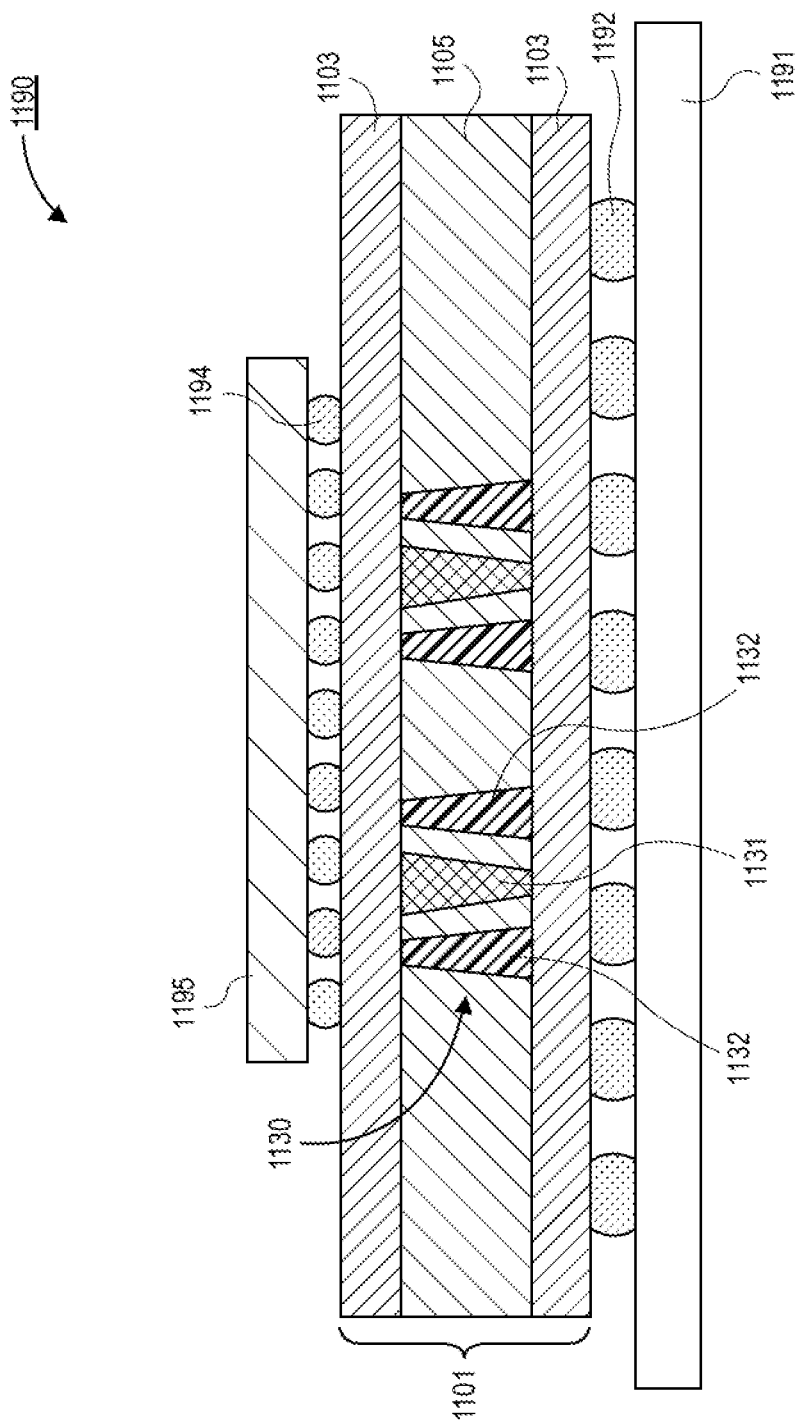
FIG. 11 is a cross-sectional illustration of an electronic system with a package substrate that includes a vertically oriented inductor embedded in the package core, in accordance with an embodiment.

Referring now to FIG. 11, a cross-sectional illustration of an electronic system 1190 is shown, in accordance with an embodiment. In an embodiment, the electronic system 1190 may comprise a board 1191. The board 1191 may be coupled to a package substrate 1101 by interconnects 1192. The interconnects 1192 may be solder balls, sockets, or the like. In an embodiment, the package substrate 1101 may comprise a core 1105 and buildup layers 1103 above and/or below the core 1105.

In an embodiment, the core 1105 is a material that can be morphologically changed upon exposure to a laser in order to implement laser-assisted etching processes. For example, the core 1105 may comprise glass. In an embodiment, one or more inductors 1130 may be embedded in the core 1105. In the illustrated embodiment, the inductors 1130 comprise a magnetic shell 1132 that surrounds a conductive via 1131. The conductive via 1131 and the magnetic shell 1132 may have sloped sidewall surfaces characteristic of laser-assisted etching processes. While a particular example of an inductor is shown in FIG. 11, it is to be appreciated that the core 1105 may comprise any of the inductors described in accordance with embodiments herein.

In an embodiment, the package substrate 1101 may be coupled to one or more dies 1195 by interconnects 1194. The interconnects 1194 may be any suitable interconnect such as a first level interconnect (FLI). The interconnects 1194 may comprise solder balls, copper pillars, or the like.

Figure 12:
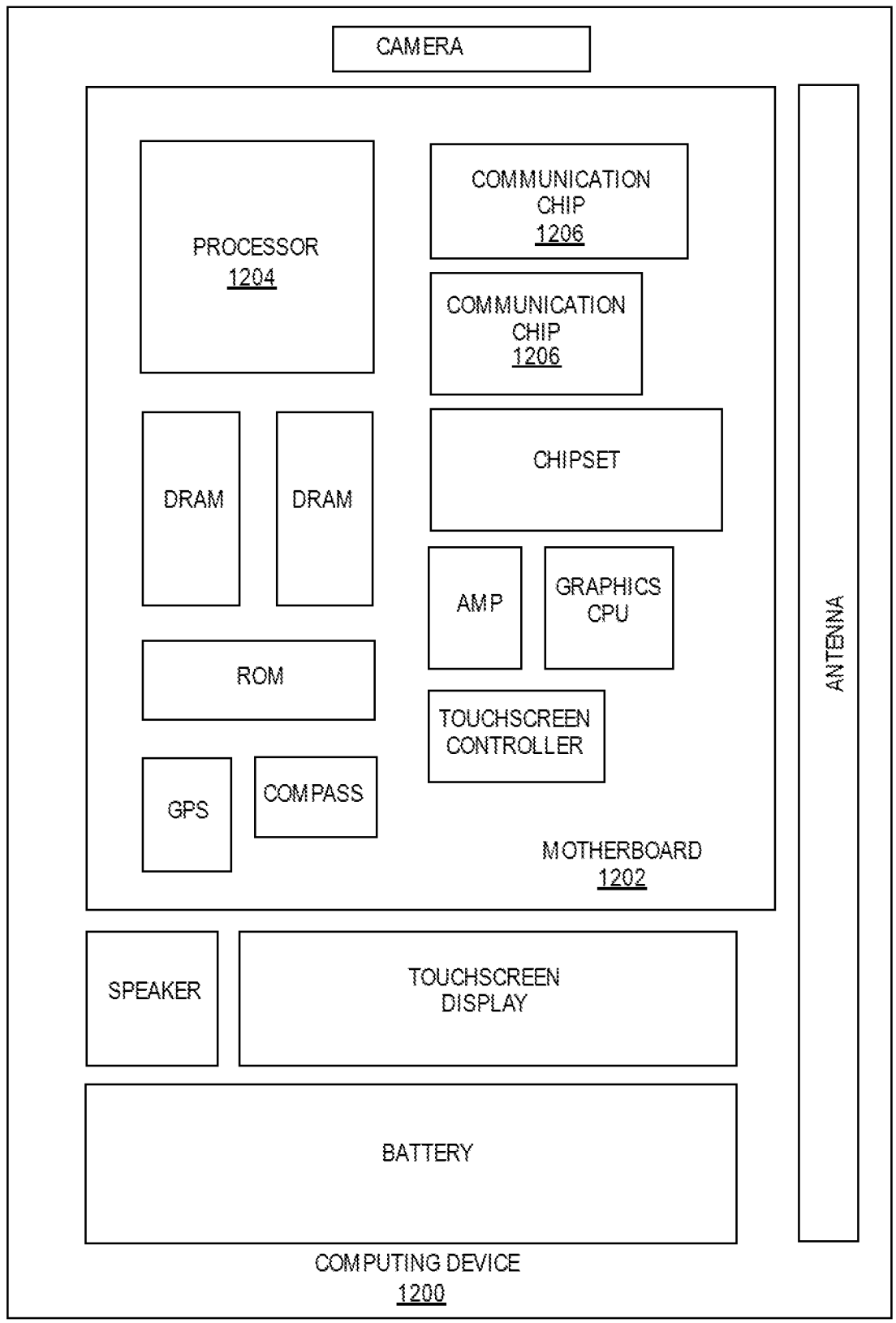
FIG. 12 is a schematic of a computing device built in accordance with an embodiment.

FIG. 12 illustrates a computing device 1200 in accordance with one implementation of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the invention, the integrated circuit die of the processor may be part of an electronic package that comprises a core that comprises vertically oriented inductors, in accordance with embodiments described herein. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of the invention, the integrated circuit die of the communication chip may be part of an electronic package that comprises a package substrate with a core that comprises vertically oriented inductors, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core; a conductive via through a thickness of the core; and a shell surrounding a perimeter of the conductive via, wherein the shell is a magnetic material, and wherein a surface of the conductive via is spaced away from the shell.

Example 2: the package substrate of Example 1, wherein the core is provided between the surface of the conductive via and the shell.

Example 3: the package substrate of Example 1 or Example 2, wherein the conductive via has sidewalls that are sloped.

Example 4: the package substrate of Example 3, wherein the shell has sidewalls that are sloped.

Example 5: the package substrate of Example 4, wherein the shell has a first wide end and wherein the conductive via has a second wide end, and wherein the first wide end is on an opposite surface of the core than the second wide end.

Example 6: the package substrate of Examples 3-5, further comprising: a hole through an axial center of the conductive via; and a plug filling the hole.

Example 7: the package substrate of Examples 3-6, wherein the conductive via has an hourglass shaped cross-section.

Example 8: the package substrate of Examples 1-7, wherein the surface of the conductive via is spaced away from the shell by a dielectric layer that is a different material than the core.

Example 9: the package substrate of Example 8, wherein the conductive via has an hourglass shaped cross-section.

Example 10: the package substrate of Examples 1-9, further comprising: a second conductive via within the shell.

Example 11: the package substrate of Example 10, wherein the second conductive via is electrically coupled to the conductive via.

Example 12: a package substrate, comprising: a core; a plurality of magnetic vias through a thickness of the core; and a via plane that wraps around the plurality of magnetic vias.

Example 13: the package substrate of Example 12, wherein the magnetic vias have an hourglass shaped cross-section.

Example 14: the package substrate of Example 12 or Example 13, wherein the via plane has an hourglass shaped cross-section.

Example 15: the package substrate of Examples 12-14, wherein the via plane wraps around the magnetic vias in a serpentine pattern.

Example 16: the package substrate of Example 15, wherein the serpentine pattern comprises a plurality of turns, wherein each turn is at approximately 90°.

Example 17: the package substrate of Example 15, wherein the serpentine pattern comprises smooth turns.

Example 18: a package substrate, comprising: a core with a first surface and a second surface; a first via through a thickness of the core; a second via through the thickness of the core, wherein the first via is coupled to the second via by a first trace over the second surface; and a third via through the thickness of the core, wherein the second via is coupled to the third via by a second trace over the first surface.

Example 19: the package substrate of Example 18, wherein the first via, the second via, and the third via have hourglass shaped cross-sections.

Example 20: the package substrate of Example 18 or Example 19, wherein the first trace and the second trace are directly contacting the core.

Example 21: the package substrate of Examples 18-20, wherein the first trace and the second trace are on buildup layers disposed over the first surface and the second surface of the core.

Example 22: the package substrate of Examples 18-21, wherein the core comprises glass.

Example 23: an electronic system, comprising: a board: a package substrate coupled to the board, wherein the package substrate comprises: a glass core; an inductor embedded in the glass core, wherein a conductive feature of the inductor has an hourglass shaped cross-section; and a die coupled to the package substrate.

Example 24: the electronic system of Example 23, wherein the conductive feature is a via through a thickness of the glass core, and wherein a magnetic shell surrounds the via.

Example 25: the electronic system of Example 23, wherein the conductive feature is a via plane, and wherein the via plane wraps around a plurality of magnetic vias.

What is claimed is:

1. A package substrate, comprising:
a core;
a conductive via through a thickness of the core; and
a shell surrounding a perimeter of the conductive via, wherein the shell is a magnetic material, and wherein a surface of the conductive via is laterally spaced apart from the shell by a portion of the core.

2. The package substrate of claim 1, wherein the conductive via has sidewalls that are sloped.

3. The package substrate of claim 2, wherein the shell has sidewalls that are sloped.

4. The package substrate of claim 3, wherein the shell has a first wide end and wherein the conductive via has a second wide end, and wherein the first wide end is on an opposite surface of the core than the second wide end.

5. The package substrate of claim 2, further comprising:
a hole through an axial center of the conductive via; and
a plug filling the hole.

6. The package substrate of claim 2, wherein the conductive via has an hourglass shaped cross-section.

7. The package substrate of claim 1, wherein the conductive via has an hourglass shaped cross-section.

8. The package substrate of claim 1, further comprising:
a second conductive via within the shell.

9. The package substrate of claim 8, wherein the second conductive via is electrically coupled to the conductive via.

10. A package substrate, comprising:
a core;

a plurality of magnetic vias through a thickness of the core; and a via plane that wraps around the plurality of magnetic vias, the via plane laterally spaced apart from the plurality of magnetic vias by a portion of the core.

11. The package substrate of claim 10, wherein the magnetic vias have an hourglass shaped cross-section.

12. The package substrate of claim 10, wherein the via plane has an hourglass shaped cross-section.

13. The package substrate of claim 10, wherein the via plane wraps around the magnetic vias in a serpentine pattern.

14. The package substrate of claim 13, wherein the serpentine pattern comprises a plurality of turns, wherein each turn is at approximately 90°.

15. The package substrate of claim 13, wherein the serpentine pattern comprises smooth turns.

16. A package substrate, comprising:
a core with a first surface and a second surface;
a first via through a thickness of the core;
a second via through the thickness of the core, wherein the first via is coupled to the second via by a first trace over the second surface; and
a third via through the thickness of the core, wherein the second via is coupled to the third via by a second trace over the first surface.

17. The package substrate of claim 16, wherein the first via, the second via, and the third via have hourglass shaped cross-sections.

18. The package substrate of claim 16, wherein the first trace and the second trace are directly contacting the core.

19. The package substrate of claim 16, wherein the first trace and the second trace are on buildup layers disposed over the first surface and the second surface of the core.

20. The package substrate of claim 16, wherein the core comprises glass.

21. An electronic system, comprising:
a board:
a package substrate coupled to the board, wherein the package substrate comprises:
a glass core;
an inductor embedded in the glass core, wherein a conductive feature of the inductor has an hourglass shaped cross-section, and wherein the inductor comprises a shell surrounding a perimeter of the conductive feature, wherein the shell is a magnetic material, and wherein a surface of the conductive feature is laterally spaced apart from the shell by a portion of the glass core; and
a die coupled to the package substrate.

22. The electronic system of claim 21, wherein the conductive feature is a via through a thickness of the glass core, and wherein a magnetic shell surrounds the via.

23. The electronic system of claim 21, wherein the conductive feature is a via plane, and wherein the via plane wraps around a plurality of magnetic vias.

* * * * *